(12) United States Patent
Hu et al.

(10) Patent No.: US 10,720,592 B2
(45) Date of Patent: Jul. 21, 2020

(54) ORGANIC LIGHT EMITTING DIODE, OLED DISPLAY SUBSTRATE AND DISPLAY DEVICE

(71) Applicants: HEFEI XINSHENG OPTOELECTRONICS TECHNOLOGY CO., LTD., Hefei, Anhui (CN); BOE TECHNOLOGY GROUP CO., LTD., Beijing (CN)

(72) Inventors: Yue Hu, Beijing (CN); Minghung Hsu, Beijing (CN); Chinlung Liao, Beijing (CN); Lifang Song, Beijing (CN); Zhaokang Fan, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/323,518

(22) PCT Filed: May 24, 2018

(86) PCT No.: PCT/CN2018/088187
§ 371 (c)(1),
(2) Date: Feb. 5, 2019

(87) PCT Pub. No.: WO2018/219200
PCT Pub. Date: Dec. 6, 2018

(65) Prior Publication Data
US 2019/0173036 A1 Jun. 6, 2019

(30) Foreign Application Priority Data
May 27, 2017 (CN) .......................... 2017 1 0391856

(51) Int. Cl.
*H01L 51/50* (2006.01)
*H01L 51/00* (2006.01)
(Continued)

(52) U.S. Cl.
CPC ............ *H01L 51/504* (2013.01); *H01L 27/32* (2013.01); *H01L 27/3206* (2013.01);
(Continued)

(58) Field of Classification Search
CPC . H01L 27/32; H01L 27/3204; H01L 27/3206; H01L 27/3209; H01L 51/50;
(Continued)

(56) References Cited

U.S. PATENT DOCUMENTS 10,490,764 B2 * 11/2019 You ..................... H01L 27/3211
2005/0104510 A1   5/2005 Parthasarathy et al.
(Continued)

FOREIGN PATENT DOCUMENTS

CN    101005122 A    7/2007
CN    102683615 A    9/2012
(Continued)

OTHER PUBLICATIONS

First Office Action of CN; Application No. 201710391856.X; dated Jul. 3, 2018; English Translation Attached.
(Continued)

*Primary Examiner* — Eduardo A Rodela
(74) *Attorney, Agent, or Firm* — Nath, Goldberg & Meyer; Joshua B. Goldberg

(57) ABSTRACT

The present disclosure relates to the field of display technology and provides an organic light emitting diode, an OLED display substrate and a display device. It can solve the problem of low continuity in inkjet printing and complicated computer programs between different materials of light emitting layers in the existing organic light emitting
(Continued)

diodes. The organic light emitting diode includes a cathode, an anode, and a functional layer between the cathode and the anode; wherein the functional layer includes a first light emitting layer and a second light emitting layer disposed in sequence in a direction away from the anode; the first light emitting layer comprises a first material emitting blue light; and the first light emitting layer and the second light emitting layer form an aggregate in excited state for emitting light of a color different from blue after the cathode and the anode are connected.

10 Claims, 2 Drawing Sheets

(51) Int. Cl.
  *H01L 51/52* (2006.01)
  *H01L 27/32* (2006.01)
(52) U.S. Cl.
  CPC ...... *H01L 27/3209* (2013.01); *H01L 51/0005* (2013.01); *H01L 51/006* (2013.01); *H01L 51/50* (2013.01); *H01L 51/5012* (2013.01); *H01L 51/5016* (2013.01); *H01L 51/5036* (2013.01); *H01L 51/5048* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5206* (2013.01); *H01L 51/5221* (2013.01); *H01L 51/5278* (2013.01)
(58) Field of Classification Search
  CPC ............. H01L 50/5012; H01L 50/5016; H01L 50/5036; H01L 50/504; H01L 50/5048; H01L 50/5088; H01L 50/52; H01L 50/5278
  See application file for complete search history.

(56) References Cited

U.S. PATENT DOCUMENTS

| | | |
|---|---|---|
| 2011/0204353 A1 | 8/2011 | Yamazaki |
| 2012/0223633 A1* | 9/2012 | Yoshinaga .......... H01L 27/3211 313/504 |
| 2012/0235127 A1 | 9/2012 | Takasu et al. |
| 2015/0155515 A1* | 6/2015 | Kim .................... H01L 51/5008 257/40 |
| 2016/0276602 A1* | 9/2016 | Yoshinaga ............. C09K 11/06 |
| 2016/0365491 A1 | 12/2016 | Chen et al. |
| 2017/0025484 A1* | 1/2017 | Forrest ................... H01L 51/56 |
| 2017/0040561 A1* | 2/2017 | Wu ....................... H01L 51/504 |
| 2017/0063374 A1* | 3/2017 | Yamamoto .......... H01L 51/5012 |
| 2018/0138435 A1* | 5/2018 | Kim .................... H01L 51/5056 |
| 2018/0375047 A1 | 12/2018 | You et al. |
| 2019/0157360 A1* | 5/2019 | Tsukamoto ............ C09K 11/06 |
| 2019/0173036 A1 | 6/2019 | Hu et al. |
| 2019/0221623 A1* | 7/2019 | Kamiyama ......... H01L 27/3211 |

FOREIGN PATENT DOCUMENTS

| | | |
|---|---|---|
| CN | 106159101 A | 11/2016 |
| CN | 106654032 A | 5/2017 |
| CN | 107154463 A | 9/2017 |

OTHER PUBLICATIONS

PCT International Search Report; Application No. PCT/CN2018/088187; dated Aug. 17, 2018; Form PCT/ISA/210 and PCT/ISA/237 with English Translation.
Peng, Zhaokuai et al.; "Study on the Photo-induced Electron Transfer and the Exciplex Formation of Some Novel Blue Emission Dyes with Aluminum Tris (8-hydroxyquinoline) Using Fluorescent Spectra Methods"; Acta Chimica Sinica vol. 61. No. (11); Nov. 20, 2003; pp. 1734-1739; ISSN: 0567-7351; With English Abstract.

* cited by examiner

ORGANIC LIGHT EMITTING DIODE, OLED DISPLAY SUBSTRATE AND DISPLAY DEVICE

TECHNICAL FIELD

The present disclosure relates to the field of display technology, particularly to an organic light emitting diode (OLED), an OLED display substrate and a display device.

BACKGROUND

In inkjet printing technology, solutions of hole transport material such as PEDOT/PSS (doped polyaniline), and materials emitting red, green and blue light are respectively sprayed into a sub-pixel pits of a substrate on which a patterned metal electrode (for example, a anode) has been previously disposed, by a micron-sized printing nozzle, thereby forming light emitting pixel units having three primary colors of red, green and blue.

The hole injection materials and the hole transport materials cooperated with the currently used light emitting materials of three colors of red, green and blue are different, and it is difficult to unify the hole injection materials and the hole transport materials cooperated with the light emitting materials of three colors into the same material due to the problem of matching of the energy levels. The light emitting materials of three colors of red, green and blue need to use three nozzles, and the printing of the nozzles need to be programmed separately, which brought difficulties to the implementation of inkjet printing, and further brought printing results due to a variety of unstable factors.

SUMMARY

In order to solve the technical problems in the prior art, the present disclosure proposes an organic light emitting diode, an OLED display substrate and a display device, which can improve the continuity of inkjet printing and avoid complicated computer programming problems due to different materials of light emitting layer.

The present disclosure provides an organic light emitting diode, including a cathode, an anode, and a functional layer between the cathode and the anode;

wherein the functional layer includes a first light emitting layer and a second light emitting layer disposed in sequence in a direction away from the anode; the first light emitting layer includes a first material emitting blue light, the first light emitting layer and the second light emitting layer form an excited aggregate emitting light of a color different from blue when the cathode and the anode are connected.

Optionally, the second light emitting layer includes a second material emitting blue light which is the same as the first material emitting blue light, and the first light emitting layer and the second light emitting layer form an excimer emitting red light when the cathode and the anode are connected.

The first material emitting blue light and the second material emitting blue light include an aromatic compound having a benzene ring while two ground state molecules thereof form a face to face configuration.

The first material emitting blue light and the second material emitting blue light may be selected from one or more of a pyrene, an alkylbenzene compound, and a 2,w-alkylpyrene.

The organic light emitting diode further includes a hole injection layer and a hole transport layer disposed in sequence between the anode and the first light emitting layer.

The organic light emitting diode further includes a hole blocking layer, an electron transport layer, and an electron injection layer disposed in sequence between the second light emitting layer and the cathode.

Optionally, the second light emitting layer includes an electron transport material, and the first light emitting layer and the second light emitting layer form an exciplex emitting green light when the cathode and the anode are connected.

The energy level of the exciplex satisfy: $hv = I_{(D)} - E_{(A)} - C$, wherein $I_{(D)}$ is a ionization potential of a donor, $E_{(A)}$ is an electron affinity potential of a acceptor, C is the coulomb energy of the exciplex.

The organic light emitting diode further includes a hole injection layer and a hole transport layer disposed in sequence between the anode and the first light emitting layer.

The organic light emitting diode further includes an electron injection layer between the second light emitting layer and the cathode.

The present disclosure also provides an OLED display substrate including any one of the above organic light emitting diode.

The organic light emitting diode includes a red organic light emitting diode, a green organic light emitting diode, and a blue organic light emitting diode.

The first light emitting layer and the second light emitting layer of the red organic light emitting diode, the first light emitting layer of the green organic light emitting diode, and the light emitting layer of the blue organic light emitting diode are made of same materials emitting blue light.

The present disclosure also provides a display device including the above OLED display substrate.

DETAILED DESCRIPTION

Figure 1:
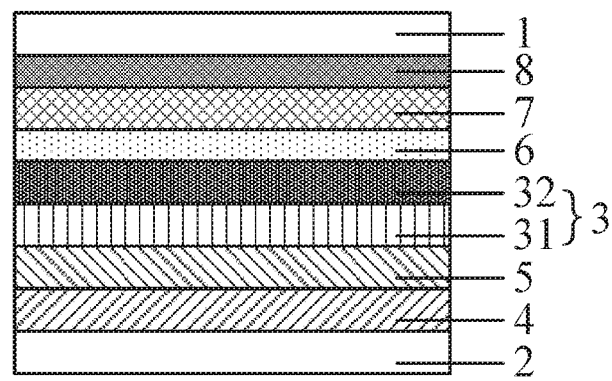
FIG. 1 is a schematic diagram showing the structure of one organic light emitting diode according to an embodiment of the present disclosure.

In order to enable those skilled in the art to better understand the technical solutions of the present disclosure, the present disclosure will be further described in detail with reference to the drawings and specific examples.

Referring to FIGS. 1 to 5, the present disclosure provides an organic light emitting diode, including a cathode 1, an anode 2 and a functional layer 3 between the cathode 1 and the anode 2;

wherein the functional layer 3 includes a first light emitting layer 31 and a second light emitting layer 32 disposed in sequence in a direction away from the anode 2, the first light emitting layer 31 includes a first material emitting blue light, and the first light emitting layer 31 and the second light emitting layer 32 form an excited aggregate emitting light of a color different from blue light when the cathode 1 and the anode 2 are connected.

Under an electric field formed when the cathode 1 and the anode 2 are connected, the first material emitting blue light in the first light emitting layer 31 and the material in the second light emitting layer 32 can form different excited aggregates capable of emitting red or green light. Therefore, in the present disclosure, the hole injection layer and the hole transport layer of the organic light emitting diode of different colors (blue, red, and green) may use same materials, thereby effectively improving the continuity of inkjet printing. At the same time, since the light emitting material uses only a material emitting blue light (no need to use a material emitting red light and a material emitting green light), it is also possible to avoid complicated computer programming problems caused by using various materials emitting different colors.

During the preparation of the organic light emitting diode, the first light emitting layer 31 and the second light emitting layer 32 do not interact with each other. Only after the cathode 1 and the anode 2 are connected to form an electric field during use, the material emitting blue light in the first light emitting layer 31 and materials in the second light emitting layer 32 form aggregates in excited state under the action of the electric field, and the aggregates in excited state are firstly formed at a position where the first light emitting layer 31 and the second light emitting layer 32 are in contact. As the time goes after the electrodes are connected, the thickness of the aggregates in excited state gradually increases. That is to say, the aggregates are not formed during the preparation process, but are formed when the cathode 1 and the anode 2 are connected for the first time to form an electric field.

Optionally, the second light emitting layer 32 includes a second material emitting blue light, the second material emitting blue light is the same as the first material emitting blue light, and the materials emitting blue light of the first light emitting layer 31 and the second light emitting layer 32 form an excimer which can emit red light after the cathode and the anode are connected.

That is to say, in a red organic light emitting diode according to the present disclosure, it is not necessary to use a material emitting red light directly to emit red light, but to generate red light by an excimer formed by two layers of material emitting blue light under the action of the electric field.

The reason why the excimer formed by the two layers of material emitting blue light can emit red light is that the first light emitting layer 31 and the second light emitting layer 32 both use the same material emitting blue light and the energy level difference between the HOMO level and the LOMO level of the material emitting blue light is small. The formed excimer has a small energy band difference, and thus the wavelength of the emitting light is large, thereby emitting red light.

Since the first light emitting layer 31 and the second light emitting layer 32 are made of the same material emitting blue light, the first material emitting blue light needs to be dried after inkjet printing to form the first light emitting layer 31, and then the second material emitting blue light (which is also the first material emitting blue light) is inkjet printed on the first light emitting layer 31 and dried to form the second light emitting layer 32 so as to avoid the mixing of the materials emitting blue light in the first light emitting layer 31 and the second light emitting layer 32. By this way, the first light emitting layer 31 and the second light emitting layer 32 having the same material can be separated.

The first material emitting blue light and the second material emitting blue light may be selected from an aromatic compound having a benzene ring, and two molecules in ground state could form a face to face configuration after heating and solidification.

Since the benzene ring is a planar structure, the aromatic compound having a benzene ring is more likely to form a face to face configuration.

Figure 2:
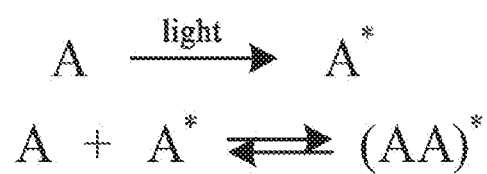
FIG. 2 is a schematic diagram showing the formation of the excimer.
Figure 3:
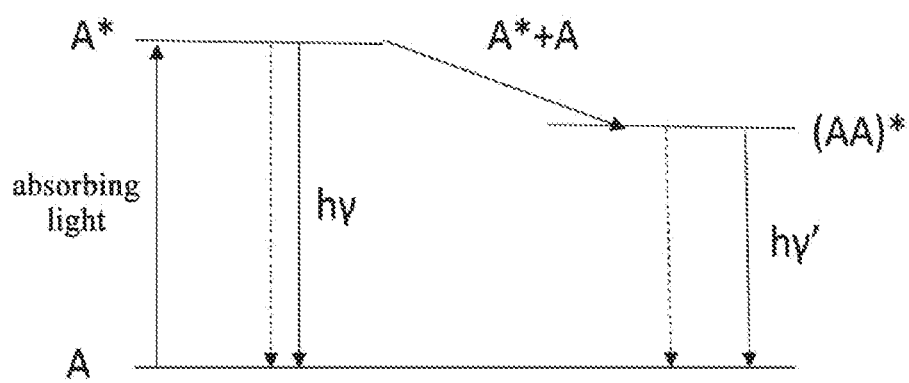
FIG. 3 is an energy level diagram of the excimer.

The formation of an excimer is shown in FIG. 2, wherein a molecule in ground state represented with A is excited after absorbing light and form a molecule in excited state represented with A*, and the molecule in ground state A and the molecule in excited state A* then form an excimer (AA)* under certain conditions. FIG. 3 shows changes in the energy level of the molecules when the excimer is formed, wherein $\gamma$ is band frequency value of a single molecular and $\gamma'$ is band frequency value of an excimer fluorescence. As can be seen in FIG. 3, the energy level of the formed molecule in excited state A* is h$\gamma$, and the energy level of the excimer (AA)* is lowered to h$\gamma'$ when the molecule in ground state A and the molecule in excited state A* form an excimer (AA)*.

In addition to being formed by the interaction of the singlet molecule in excited state A* with a singlet molecule A in ground state, the excimer can also be produced by collisional annihilation of two triplet molecules $A^T$, which will not be described herein.

The two molecules in ground state for forming the excimer must have a relatively strict geometric configuration. The two molecules in ground state need to form a face to face geometric configuration, wherein both of them need to be partially or completely overlapped and the interfacial distance is about 0.3 nm. Therefore, in a solution, the molecules in excited state adjust its position by molecular motion to achieve the geometric requirements for forming the excimer. It should be noted that since the formation of the excimer requires an appropriate temperature and a certain thermal activation energy. If the temperature is too high, the molecular motion is accelerated, thereby accelerating the dissociation of the excimer, therefore a decrease in temperature is favorable for the formation of the excimer. However, if the temperature is too low, the molecular rotational motion is hindered, which is also detrimental to the formation of the excimer. For different materials, temperatures at which they can form excimers are different, and those skilled in the art can determine the temperatures of heating and solidification depending on the specific material emitting blue light.

Preferably, the material emitting blue light of the first light emitting layer and the second light emitting layer may be selected from any one of a pyrene, an alkylbenzene compound, and a 2,w-alkylpyrene.

Specifically, the material emitting blue light may be any one of the following materials:

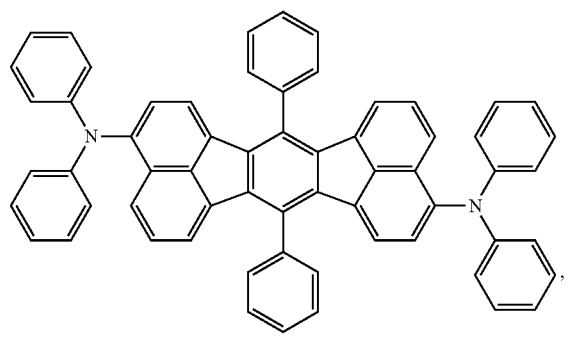

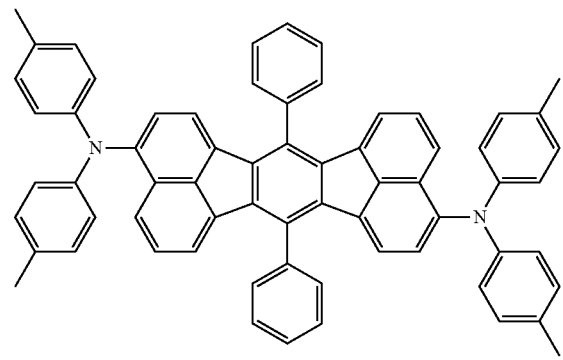

or a material having the following general formula:

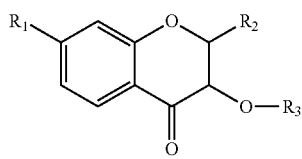

wherein $R_1$ is one of H, an alkyl group having 1 to 6 C atoms, $CH_3O$, a halogen atom, $CF_3$, $NO_2$, and CN; $R_2$ is one of a phenyl group, a p-methylphenyl group, an o-methylphenyl group, and a p-methoxyphenyl group; $R_3$ is one of a phenyl group, a p-methylphenyl group, a p-isopropylphenyl group, a p-tert-butylphenyl group, a biphenyl group, and a p-phenoxyphenyl group.

These aromatic compounds are liable to form excimers. For example, fluorescence of the excimer in crystal of pyrene can be observed because the pyrene molecules are arranged in parallel in pairs in the crystal. A two-unit group as shown in the following figure can be formed, and the distance between the molecules is 3.54 Å which satisfies the requirement of forming an excimer.

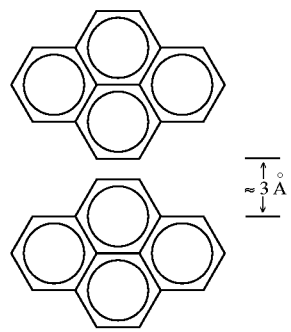

For another example, the alkylbenzene compound can form an intramolecular excimer in a concentrated solution and in a solid state provided that the alkylbenzene compound should conform to the law of n=3. That is to say, through the free internal rotation of the carbon chain, the two chromophores attached to the same molecular chain reach a face to face configuration with an interfacial distance of about 2.54 Å to form an excimer (as shown in the figure below).

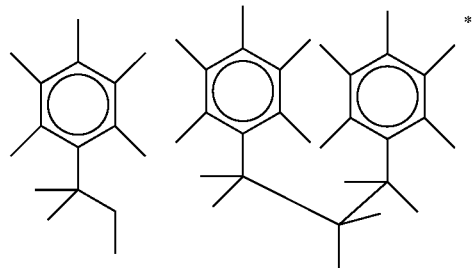

For yet another example, a series of 2,w-alkylpyrene (i.e., pyrene-$(CH2)_n$— pyrene) when n=1, 2, 3, . . . , 22, all have a formation of intramolecular excimer except for n=7 or 8, and fluorescence of the excimer in the case of n=3 is the strongest.

Of course, for polymers, vinyl polymers with pendant groups all conform to the law of n=3, such as polyethylene naphthalene, polyvinyl carbazole and the like, therefore it is easy to observe the intracellular molecular excimer fluorescence bands. In a polymer solution, there are three cases in which an excimer is formed: (1) between adjacent chromophores in a molecule; (2) between non-adjacent chromophores in a main chain which are close enough due to curliness of a flexible chain, such that there is interaction between the remote chromophores within the molecular chain; (3) between chromophores in different molecular chains interacted when they are close enough to each other. Therefore, the first material emitting blue light and the second material emitting blue light are not limited to the above substances as long as conditions for generating the excimer are satisfied, which will not be described herein.

As shown in FIG. 1, the red organic light emitting diode has a structure comprising a anode 2, a hole injection layer 4, a hole transport layer 5, a first light emitting layer 31, a second light emitting layer 32, a hole blocking layer 6, a electron transport layer 7, a electron injection layer 8, and a cathode 1 which are sequentially formed.

Alternatively, the second light emitting layer 32 includes an electron transport material, and the first light emitting layer 31 and the second light emitting layer 32 form an exciplex emitting green light after the cathode 1 and the anode 2 are connected.

The electron transport material of the second light emitting layer 32 may be selected from a n-type organic semiconductor material of which HOMO level is 0.1 eV to 0.5 eV lower than the HOMO level of the material emitting blue light and the LUMO level is 0.1 eV to 0.3 eV higher than the LUMO level of the material emitting blue light. Specific examples include one or more of the following materials, and the substituents of the material may also be suitably optimized:

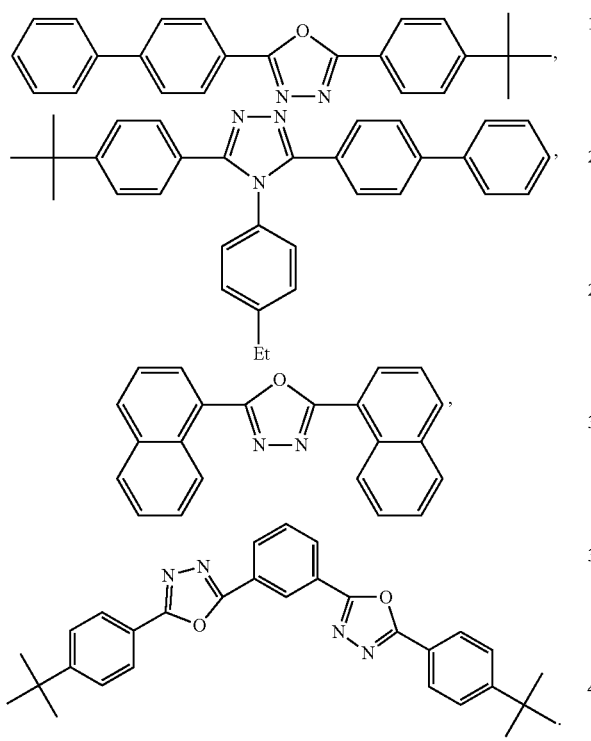

That is to say, in a green organic light emitting diode according to the present disclosure, it is not necessary to use a material emitting green light directly to emit green light, but to generate green light by an exciplex formed by the material emitting blue light and the electron transport material under the action of the electric field.

The reason why the exciplex formed by the material emitting blue light and the electron transport material can emit green light is that the energy level difference between the HOMO level of the first blue luminescent material in the first light emitting layer 31 and the HOMO level of electron transport material in the second light emitting layer 32 is large, and the energy level difference between the LOMO level of the first blue luminescent material and the LOMO level of electron transport material is large. Therefore, the formed exciplex has a large energy band difference, and the wavelength of the formed light is small, thereby emitting green light.

Figure 5:
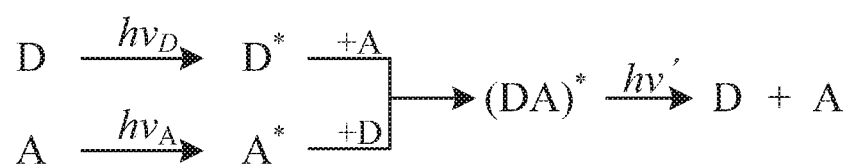
FIG. 5 is a schematic diagram showing the formation of the exciplex.

The formation of the exciplex is shown in FIG. 5, wherein a acceptor molecule in ground state represented with A is excited after absorbing light and form an acceptor molecule in excited state represented with A*; a donor molecule in ground state represented with D is excited after absorbing light and form an donor molecule in excited state represented with D*; and the acceptor molecule A and the donor molecule in excited state D* or the acceptor molecule in excited state A* and the donor molecule D combined respectively and form an exciplex (DA)* under certain conditions.

The exciplex has energy levels satisfy $hv=I_{(D)}-E_{(A)}-C$, wherein $I_{(D)}$ is a ionization potential of the donor, $E_{(A)}$ is an electron affinity potential of the acceptor, C is a coulomb energy of the exciplex.

For an exciplex having strong polar formed by typical donors and acceptors, the band of the exciplex is red-shifted as the polarity of the solvent increases, therefore the color of the exciplex can be adjusted in green light range by controlling the polarity of the solvent used in printing.

The formation of exciplex does not need have as strict geometric requirements as the formation of excimers, because the formation of exciplex is primarily based on the charge transfer interactions between the donor and acceptor molecules.

It can be understood that the ionization potential of the donor is greater than the electron affinity potential of the acceptor. When the ionization potential of the first material emitting blue light is greater than the electron affinity potential of the electron transport material, the first material emitting blue light is a donor, and the electron transport material is an acceptor. Conversely, when the ionization potential of the electron transport material is greater than the electron affinity acceptor of the first material emitting blue light, the electron transport material is a donor, and the first material emitting blue light is an acceptor, which will not be described herein.

The formation of exciplex is exemplified below.

If chromophores of the donor and acceptor are attached to the same molecular chain, an intramolecular exciplex can be formed, as shown in the following figure:

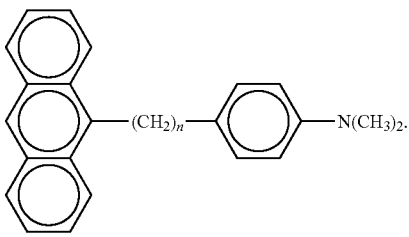

If chromophores of the donor and acceptor are attached to the molecular main chain of the polymer, an exciplex in the polymer molecule can also be formed, as shown in the following figure:

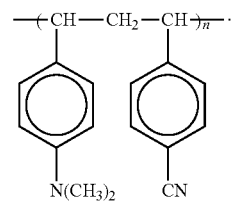

Of course, a chromophore of the polymer can also form an exciplex with small molecules. In addition, a ternary exciplex (DDA)* or (DAA)* may also be formed, which will not be described herein.

Figure 4:
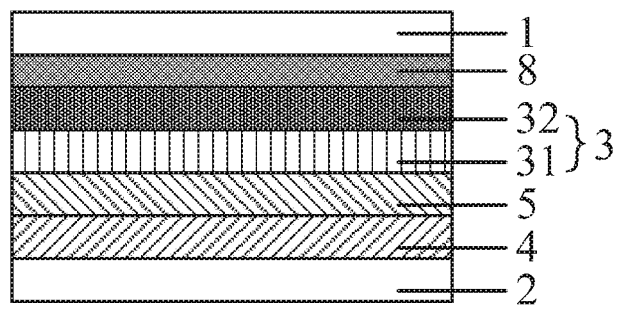
FIG. 4 is a schematic diagram showing the structure of another organic light emitting diode according to an embodiment of the present disclosure.

As shown in FIG. 4, a green organic light emitting diode has a structure comprising a anode 2, a hole injection layer 4, a hole transport layer 5, a first light emitting layer 31, a second light emitting layer 32, an electron injection layer 8, and a cathode 1 which are sequentially formed. That is to say, a hole blocking layer is not provided in the green organic light emitting diode, so that the second light emitting layer 32 can simultaneously function as an electron transport layer.

As for a red organic light emitting diode and a green organic light emitting diode, the color of the emitting lights can be controlled by forming an excimer or an exciplex from the first light emitting layer 31 and the second light emitting layer 32, therefore the same hole injection material and hole transport material can be used for three color organic light emitting diode. That is to say, in the red organic light emitting diode and the green organic light emitting diode, the same hole injection material is simultaneously printed and dried to form the hole injection layer 4, and then the same hole transport material is simultaneously printed on the hole injection layer 4 and dried to form the hole transport layer 5, thereby effectively improving the continuity of inkjet printing.

Figure 6:
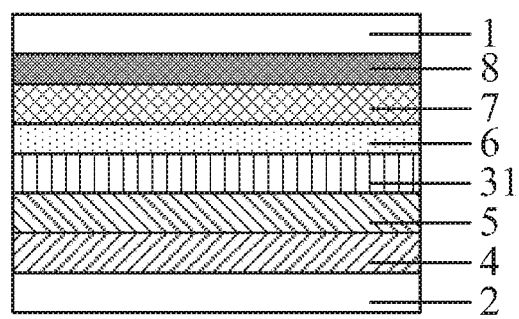
FIG. 6 is a schematic diagram showing the structure of a blue organic light emitting diode according to an embodiment of the present disclosure.

The blue organic light emitting diode may have a structure as shown in FIG. 6, specifically, a anode 2, a hole injection layer 4, a hole transport layer 5, a first light emitting layer 31, a hole blocking layer 6, an electron transport layer 7, an electron injection layer 8, and a cathode 1 which are sequentially formed.

In the blue organic light emitting diode, since the first light emitting layer 31 is made of a material emitting blue light, blue light can be emitted without materials of other layers. Moreover, the materials for a hole injection layer 4 and a hole transport layer 5 in the blue organic light emitting diode are the same as those in the red organic light emitting diode and the green organic light emitting diode, therefore all these layers can be formed at the same time.

Hereinafter, the overall process for manufacturing an organic light emitting diode will be described in detail.

First, an ITO film layer 1 is prepared on a substrate for inkjet printing using a sputtering method; the substrate is then passed into an glove box for inkjet printing to print a hole injection layer (HIL) with a material selected from PEDOT. All pixels were printed in automatic mode, and after printing, the substrate was transferred into a vacuum oven and baked at a baking temperature of 180° C. for 15 min.

The substrate being baked is cooled to the room temperature, and then it is transferred into an glove box for inkjet printing to print a hole transport layer (HTL). The solute of the hole transport layer material is a p-type semiconductor material which may be selected from an aromatic amine compound. Specifically, the solute can be one or more of the following materials and the derived materials on which the substituent is appropriately changed.

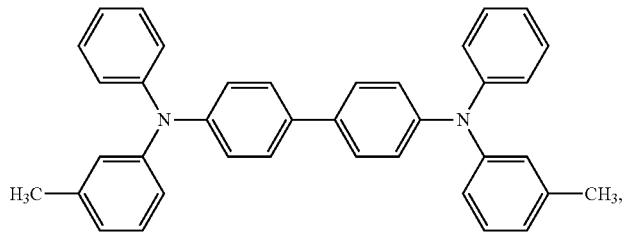

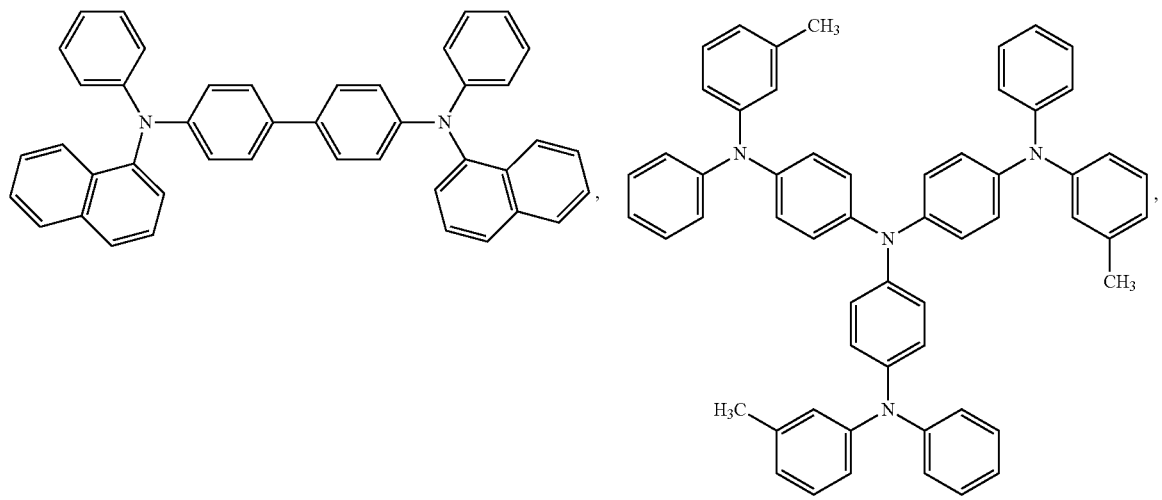

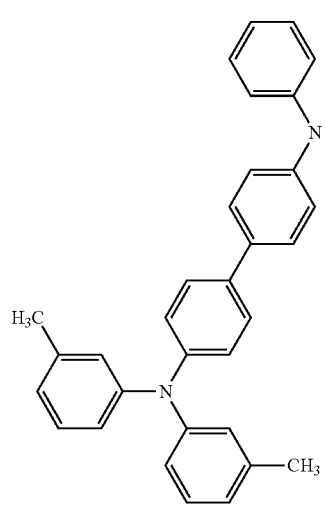
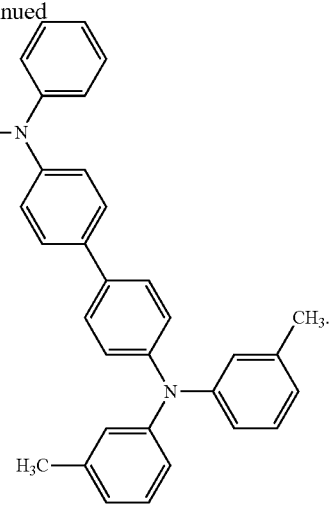

TPTE

The solvent can be anisole, 1 g of the above solute was dissolved in 5 ml of the solvent and heated at 60° C. for 1 h to obtain an HTL solution. The HTL solution is printed by the same mode of the HIL, and all the pixels are printed in an automatic mode. After printing, it is baked in a vacuum oven at a baking temperature of 180° C. for 1 h, and then it is transferred to the glove box for printing after being cooled to room temperature.

In a solution for preparing the light emitting layer (EML), the solute is a doped structure, the host is an n-type organic semiconductor material, and the guest is a material emitting blue light with a doping concentration of 1% to 10%. Specifically, 1 g of the light emitting layer solutes were weighed and put into a beaker, and 5 ml of methyl acrylate was added as a solvent. The obtained solution was heated and stirred at 80° C. for 1 h until the solution was homogeneous, and then the solution was cooled to room temperature. The first light emitting layer was printed in an automatic mode for all pixels, and then was transferred to a vacuum oven for baking at a baking temperature of 150° C. for 10 minutes after printing.

The substrate being baked is cooled to room temperature and then returned to the glove box. The printer is adjust to a program that only print the red sub-pixels and print the second light emitting layer in red sub-pixels. After printing, the substrate was transferred to a vacuum oven and baked at a baking temperature of 150° C. for 10 minutes.

The substrate being baked is cooled to room temperature and then passed to an evaporation machine. A hole blocking layer (HBL) is vapor-deposited only in the red sub-pixel and the blue sub-pixel by using a mask. Then, an electron transport layer (ETL), an electron injection layer (EIL), and a cathode (AI) were deposited on all the pixels of the substrate, thereby producing an organic light emitting diode.

For the existing organic light emitting diode of different colors such as red, green and blue light, the light emitting layer needs to be made by using three different color solutions, which requires changing the inkjet printing nozzle when printing different colors. Moreover, in terms of software programming, since the volume and position of the three colors of red, green and blue are different, it also needs to adjust the position, angle and number of ink drops when inkjet printing, which increases the complexity. However, in the organic light emitting diode of the present disclosure, the light emitting materials only needs to adopt materials emitting blue light, and thus there is no need to change the inkjet printing nozzle or require complicated software programming. Therefore, the manufacturing of the organic light emitting diode of the present disclosure is simpler and easier to operate.

The present disclosure also provides an OLED display substrate including any one of the above organic light emitting diode.

The organic light emitting diode includes a red organic light emitting diode, a green organic light emitting diode, and a blue organic light emitting diode; wherein the first light emitting layer and the second light emitting layer of the red organic light emitting diode, the first light emitting layer of the green organic light emitting diode, and the light emitting layer of the blue organic light emitting diode are made of the same material emitting blue light.

since the OLED display substrate of the present disclosure includes the above organic light emitting diode, the same material can be used for the hole injection layer and the hole transport layer for different color organic light emitting diode, which can greatly improve the continuity of inkjet printing and avoid complicated computer programming problems between different light emitting layer materials.

The present disclosure also provides a display device including the above OLED display substrate. The display device may be electronic paper, OLED panel, mobile phone, tablet personal computer, television, display, laptop, digital photo frame, navigator and the like with any display product or component.

Since the display device of the present disclosure includes the above OLED display substrate, the same material can be used for the hole injection layer and the hole transport layer for different color organic light emitting diodes, which can greatly improve the continuity of inkjet printing and avoid complicated computer programming problems between different light emitting layer materials.

It can be understood that the above examples are merely exemplary examples employed for illustrating the principle of the present disclosure, but the present disclosure is not limited thereto. For a person skilled in the art, various variations and modifications may be made without departing from the spirit and essence of the present disclosure, and these variations and modifications are also considered to be within the protection scope of the present disclosure.

The invention claimed is:

1. An organic light emitting diode, including a cathode, an anode, and a functional layer between the cathode and the anode;
   wherein the functional layer includes a first light emitting layer and a second light emitting layer disposed in sequence in a direction away from the anode;
   the first light emitting layer comprises a first material emitting blue light; and
   the second light emitting layer includes a second material emitting blue light, the first light emitting layer and the second light emitting layer form an excimer emitting red light after the cathode and the anode are connected; or
   the second light emitting layer includes an electron transport material, and the first light emitting layer and the second light emitting layer form an exciplex emitting green light after the cathode and the anode are connected.

2. The organic light emitting diode according to claim 1, characterized in that the first material emitting blue light and the second material emitting blue light are the same.

3. The organic light emitting diode according to claim 2, characterized in that the first material emitting blue light and the second material emitting blue light include an aromatic compound having a benzene ring and two molecules in ground state of the aromatic compound form a face-to-face configuration.

4. The organic light emitting diode according to claim 3, characterized in that the first material emitting blue light and the second material emitting blue light include one of a pyrene, an alkylbenzene compound, and a 2,w-alkylpyrene.

5. The organic light emitting diode according to claim 1, characterized in that when the second light emitting layer includes the second material emitting blue light, the organic light emitting diode further includes a hole injection layer and a hole transport layer disposed in sequence between the anode and the first light emitting layer, and a hole blocking layer, an electron transport layer, and an electron injection layer disposed in sequence between the second light emitting layer and the cathode.

6. The organic light emitting diode according to claim 1, characterized in that the exciplex has an energy level satisfying $h\nu = I_{(D)} - E_{(A)} - C$, wherein $I_{(D)}$ is a ionization potential of a donor, $E_{(A)}$ is an electron affinity potential of a acceptor, and C is a coulomb energy of the exciplex.

7. The organic light emitting diode according to claim 1, characterized in that when the second light emitting layer includes the electron transport material, the organic light emitting diode further includes a hole injection layer and a hole transport layer disposed in sequence between the anode and the first light emitting layer, and an electron injection layer between the second light emitting layer and the cathode.

8. An OLED display substrate, including the organic light emitting diode according to claim 1.

9. The OLED display substrate according to claim 8, characterized in that the organic light emitting diode includes a red organic light emitting diode, a green organic light emitting diode, and a blue organic light emitting diode; and
   the first light emitting layer and the second light emitting layer of the red organic light emitting diode, the first light emitting layer of the green organic light emitting diode, and the light emitting layer of the blue organic light emitting diode are made of the same material emitting blue light.

10. A display device, characterized in that the display device includes the OLED display substrate according to claim 8.

* * * * *